(12) United States Patent
Yaocheng et al.

(10) Patent No.: US 7,875,511 B2
(45) Date of Patent: Jan. 25, 2011

(54) CMOS STRUCTURE INCLUDING DIFFERENTIAL CHANNEL STRESSING LAYER COMPOSITIONS

(75) Inventors: Liu Yaocheng, Elmsford, NY (US); Ricardo A. Donaton, Cortlandt Manor, NY (US); Kern Rim, Yorktown Heights, NY (US)

(73) Assignee: International Business Machines Corporation, New York, NY (US)

( * ) Notice: Subject to any disclaimer, the term of this patent is extended or adjusted under 35 U.S.C. 154(b) by 626 days.

(21) Appl. No.: 11/685,458

(22) Filed: Mar. 13, 2007

(65) Prior Publication Data

US 2008/0224218 A1    Sep. 18, 2008

(51) Int. Cl.
*H01L 21/8238* (2006.01)
(52) U.S. Cl. ............................ 438/199; 438/44; 438/93; 438/197; 438/222; 438/285; 438/413; 438/416; 438/429; 438/442; 257/49; 257/338; 257/350; 257/351; 257/371; 257/E29.021; 257/E29.025; 257/E29.027; 257/E29.047
(58) Field of Classification Search ................ 257/351, 257/49, 338, 350, 369, 371, E29.021, E29.025, 257/E29.027, E29.047; 438/93, 197, 199, 438/285, 44, 222, 413, 416, 429, 442
See application file for complete search history.

(56) References Cited

U.S. PATENT DOCUMENTS

| | | | |
|---|---|---|---|
| 6,190,975 B1 * | 2/2001 | Kubo et al. ................. | 438/285 |
| 6,303,450 B1 * | 10/2001 | Park et al. ................... | 438/300 |
| 6,492,216 B1 * | 12/2002 | Yeo et al. .................... | 438/197 |
| 6,911,379 B2 * | 6/2005 | Yeo et al. .................... | 438/480 |
| 2002/0011617 A1 | 1/2002 | Kubo et al. | |
| 2005/0085022 A1 | 4/2005 | Chidambarrao et al. | |
| 2005/0139930 A1 * | 6/2005 | Chidambarrao et al. ..... | 257/369 |
| 2005/0285187 A1 * | 12/2005 | Bryant et al. ............... | 257/335 |
| 2006/0046507 A1 * | 3/2006 | Tweet ......................... | 438/758 |
| 2006/0081875 A1 * | 4/2006 | Lin et al. .................... | 257/190 |
| 2007/0096149 A1 * | 5/2007 | Liu et al. .................... | 257/192 |

OTHER PUBLICATIONS

Donaton et al., in "Design and Fabrication of MOSFETs with a Reverse Embedded SiGe (Rev. e-SiGe) Structure," IEDM Technical Digest, 2006.

* cited by examiner

*Primary Examiner*—Fernando L Toledo
*Assistant Examiner*—John P Dulka
(74) *Attorney, Agent, or Firm*—Scully, Scott, Murphy & Presser, P.C.; H. Daniel Schnumann

(57) ABSTRACT

A CMOS structure includes an n-FET device comprising an n-FET channel region and a p-FET device comprising a p-FET channel region. The n-FET channel region includes a first silicon material layer located upon a silicon-germanium alloy material layer. The p-FET channel includes a second silicon material layer located upon a silicon-germanium-carbon alloy material layer. The silicon-germanium alloy material layer induces a desirable tensile strain within the n-FET channel. The silicon-germanium-carbon alloy material layer suppresses an undesirable tensile strain within the p-FET channel region. A silicon-germanium-carbon alloy material from which is comprised the silicon-germanium-carbon alloy material layer may be formed by selectively incorporating carbon into a silicon-germanium alloy material from which is formed the silicon-germanium alloy material layer.

20 Claims, 4 Drawing Sheets

CMOS STRUCTURE INCLUDING DIFFERENTIAL CHANNEL STRESSING LAYER COMPOSITIONS

BACKGROUND

1. Field of the Invention

The invention relates generally to complementary metal oxide semiconductor (CMOS) structures. More particularly, the invention relates to CMOS structures with enhanced performance.

2. Description of the Related Art

Field effect transistors (FETs) are frequently used as switching devices or signal processing devices within semiconductor circuits. In order to provide for decreased power consumption, field effect transistors are frequently fabricated within the context of a complementary doped (i.e., including an n conductivity type dopant and a p conductivity type dopant) pair of field effect transistors that is typically referred to as a complementary metal oxide semiconductor (CMOS) structure.

Recent advances in field effect transistor structure and device fabrication have centered on the use of mechanically stressed layers within field effect transistor structures to provide mechanically strained channel regions within the field effect transistor structures. In turn, the mechanically strained channel regions are intended to provide for enhanced charge carrier mobility within field effect transistor devices. Typically, within the context of conventional crystallographic orientations of semiconductor substrates that are used for fabricating field effect transistor structures, a tensile channel strain is desirable for enhanced electron charge carrier mobility within an n-FET device channel, while a compressive channel strain is desirable for enhanced hole charge carrier mobility within a p-FET device channel.

In accordance with the above described desirable FET device polarity based channel strain differences, it is thus clear that complementary doped FET devices within CMOS structures benefit from complementary stress and strain levels. However, such differential stress and strain levels within an n-FET channel in comparison with a p-FET channel are often difficult to efficiently engineer when designing and fabricating a CMOS structure.

Various CMOS structures having enhanced performance, and methods for fabricating the CMOS structures, are known in the semiconductor fabrication art. A particular example of an enhanced performance CMOS structure is disclosed within Donaton et al., in "Design and Fabrication of MOSFETs with a Reverse Embedded SiGe (Rev. e-SiGe) Structure," IEDM Technical Digest, 2006 (use of a silicon-germanium alloy stressor layer within a silicon/silicon-germanium alloy bilayer n-FET channel structure).

Semiconductor structure and semiconductor device dimensions are certain to continue to decrease, while demands for enhanced semiconductor device performance are certain to continue to increase. Thus, desirable are CMOS structures that provide enhanced performance at decreased dimensions, as well as methods for fabricating those CMOS structures.

SUMMARY OF THE INVENTION

The invention includes a CMOS structure and a method for fabricating the CMOS structure. The CMOS structure comprises an n-FET device that includes a channel comprising a silicon material layer located upon a silicon-germanium alloy material layer. The CMOS structure also comprises a p-FET device that includes a channel comprising a silicon material layer located upon a silicon-germanium-carbon alloy material layer.

Within the invention: (1) the silicon-germanium alloy material layer induces a desirable tensile strain within the n-FET device channel; and (2) the silicon-germanium-carbon alloy material layer is intended to suppress an undesirable tensile strain within the p-FET device channel.

A semiconductor structure in accordance with the invention includes an n-FET device and a p-FET device located within a substrate. The n-FET device has a first channel comprising a first silicon material layer located upon a silicon-germanium alloy material layer. The p-FET device has a second channel comprising a second silicon material layer located upon a silicon-germanium-carbon alloy material layer.

A particular method for fabricating the semiconductor structure in accordance with the invention includes forming over a substrate a first region comprising a first silicon material layer located upon a silicon-germanium alloy material layer. The first region is laterally separated from a second region comprising a second silicon material layer located upon a silicon-germanium-carbon alloy material layer that is also formed over the substrate. This particular method also includes forming over the substrate an n-FET that uses the first region as a first channel and a p-FET that uses the second region as a second channel.

Another particular method for fabricating the semiconductor structure in accordance with the invention includes forming a silicon-germanium alloy material layer over a substrate. This other method also includes incorporating carbon selectively into the silicon-germanium alloy material layer to form a silicon-germanium alloy material sub-layer laterally adjacent a silicon-germanium-carbon alloy material sub-layer over the substrate. This other method also includes forming a first silicon material sub-layer upon the silicon-germanium material sub-layer and a second silicon material sub-layer upon the laterally adjacent silicon-germanium-carbon alloy material sub-layer. This other method also includes forming an n-FET using the first silicon material sub-layer and the silicon-germanium alloy material sub-layer as a channel. This other method also includes forming a p-FET using the second silicon material sub-layer and the silicon-germanium-carbon alloy material sub-layer as a channel.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which comprises a CMOS structure further including differing channel materials compositions that provide differing mechanical stress and strain levels within an n-FET device channel and a p-FET device channel within the CMOS structure, is understood within the context of the description that follows. The description that follows is understood within the context of the drawings described above. Since the drawings are intended for illustrative purposes, the drawings are not necessarily drawn to scale.

Figure 1:
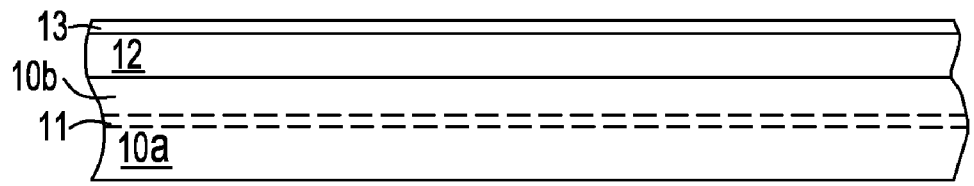
FIG. 1 to FIG. 14 show a series of schematic cross-sectional diagrams illustrating the results of progressive stages in fabricating a CMOS structure in accordance with a particular embodiment of the invention. The particular embodiment of the invention comprises a preferred embodiment of the invention.

FIG. 1 to FIG. 14 show a series of schematic cross-sectional diagrams illustrating the results of progressive stages in fabricating a CMOS structure in accordance with a particular embodiment of the invention. The particular embodiment of the invention comprises a preferred embodiment of the invention. FIG. 1 shows a schematic cross-sectional diagram of the CMOS structure at an early stage in fabrication thereof in accordance with the preferred embodiment.

FIG. 1 shows a base semiconductor substrate 10a. A buried dielectric layer 11 is located upon the base semiconductor substrate 10a, and a surface semiconductor layer 10b is located upon the buried dielectric layer 11. In an aggregate, the base semiconductor substrate 10a, the buried dielectric layer 11 and the surface semiconductor layer 10b comprise a semiconductor-on-insulator substrate.

FIG. 1 also shows a silicon-germanium alloy material layer 12 located upon the surface semiconductor layer 10b. FIG. 1 finally shows a screen layer 13 located upon the silicon-germanium alloy material layer 12.

The base semiconductor substrate 10a may in general comprise any of several semiconductor materials. Non-limiting examples include silicon, germanium, silicon-germanium alloy, silicon carbide, silicon-germanium-carbon alloy and compound (i.e., III-V and II-VI) semiconductor materials. Non-limiting examples of compound semiconductor materials include gallium arsenide, indium arsenide and indium phosphide semiconductor materials. However, more specifically, the base semiconductor substrate 10a typically comprises a silicon semiconductor material having a conventional thickness. The buried dielectric layer 11 may comprise any of several dielectric materials. Non-limiting examples include oxides, nitrides and oxynitrides, particularly of silicon, but oxides, nitrides and oxynitrides of other elements are not excluded. The buried dielectric layer 11 may comprise a crystalline or a non-crystalline dielectric material, with crystalline dielectric materials being highly preferred. The buried dielectric layer 11 may be formed using any of several methods. Non-limiting examples include ion implantation methods, thermal or plasma oxidation or nitridation methods, chemical vapor deposition methods and physical vapor deposition methods. Typically, the buried dielectric layer 11 comprises an oxide of the semiconductor material from which is comprised the base semiconductor substrate 10a (i.e., in accordance with above disclosure, typically a silicon oxide). Typically, the buried dielectric layer 11 has a thickness from about 500 to about 2000 angstroms.

The surface semiconductor layer 10b may comprise any of the several semiconductor materials from which the base semiconductor substrate 10a may be comprised. The surface semiconductor layer 10b and the base semiconductor substrate 10a may comprise either identical or different semiconductor materials with respect to chemical composition, dopant polarity, dopant concentration and crystallographic orientation. Similarly with the base semiconductor substrate 10a, the surface semiconductor layer 10b typically comprises a silicon semiconductor material. Typically, the surface semiconductor layer 10b and the base semiconductor substrate 10a have the same crystallographic orientation. Typically, the surface semiconductor layer 10b may have a thickness from about 50 to about 2000 angstroms.

The semiconductor-on-insulator substrate portion of the semiconductor structure that is illustrated in FIG. 1 may be fabricated using any of several methods. Non-limiting examples include lamination methods, layer transfer methods and separation by implantation of oxygen (SIMOX) methods.

Although FIG. 1 illustrates an embodiment of the invention within the context of a semiconductor-on-insulator substrate comprising the base semiconductor substrate 10a, the buried dielectric layer 11 and the surface semiconductor layer 10b, neither the instant embodiment nor the invention is so limited. Rather, the instant embodiment and alternative embodiments may also be practiced under certain circumstances using a bulk semiconductor substrate (that would otherwise result from absence of the buried dielectric layer 11 under circumstances where the base semiconductor substrate 10a and the surface semiconductor layer 10b have identical chemical composition and crystallographic orientation). For simplicity, subsequent cross-sectional diagrams within the instant embodiment are illustrated absent the buried dielectric layer 11, and with a single semiconductor substrate 10 (or a derivative thereof) rather than a base semiconductor substrate 10a and a surface semiconductor layer 10b.

The silicon-germanium alloy material layer 12 typically comprises a silicon-germanium alloy that includes a germanium content from about 5 to about 50 atomic percent. The silicon-germanium alloy material layer 12 is typically formed using an epitaxial chemical vapor deposition method that preserves a crystallographic orientation of the surface semiconductor layer 10b (that typically comprises a silicon semiconductor material), into the silicon-germanium alloy material layer 12. The epitaxial chemical vapor deposition method may be otherwise generally conventional in the semiconductor fabrication art and use a silicon source material and a germanium source material (as well as deposition conditions) that are also otherwise generally conventional in the semiconductor fabrication art. Typically, the silicon-germanium alloy material layer 12 has a thickness from about 50 to about 1000 angstroms.

The screen layer 13 is intended as comprising a screen material that provides for inhibited ion implantation channeling incident to further processing of the CMOS structure whose schematic cross-sectional diagram is illustrated in FIG. 1. Thus, such a screen material typically comprises a dielectric oxide material, a dielectric nitride material or a dielectric oxynitride material. The screen material may be formed using any of several methods that are generally conventional in the semiconductor fabrication art. Non-limiting examples of methods include thermal or plasma oxidation or nitridation methods, chemical vapor deposition methods and physical vapor deposition methods. Typically, the screen layer 13 comprises a silicon oxide screen material. Typically, the screen layer 13 has a thickness from about 10 to about 500 angstroms.

Figure 2:
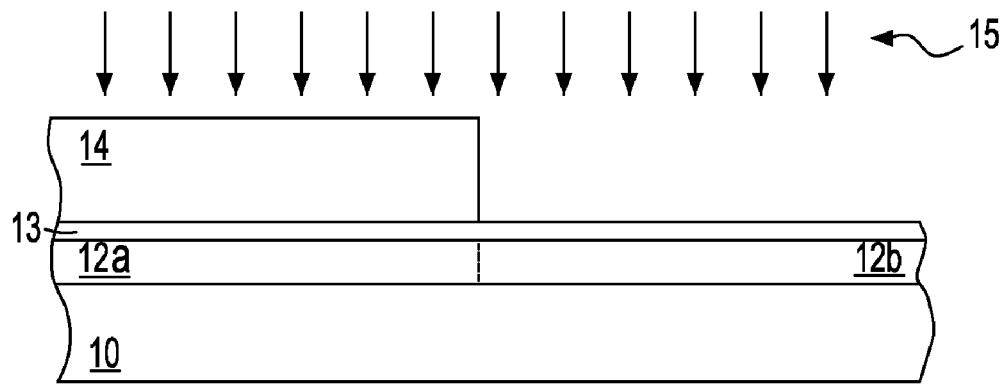

FIG. 2 first shows a mask layer 14 located upon and covering a left hand side of the CMOS structure whose schematic cross-sectional diagram is illustrated in FIG. 1. This left hand side of the CMOS structure whose schematic cross-sectional diagram is illustrated in FIG. 2 is intended for fabrication of an n-FET device, while the uncovered right hand side of the CMOS structure whose schematic cross-sectional diagram is illustrated in FIG. 2 is intended for fabrication of a p-FET device.

The mask layer 14 may comprise any of several mask materials that are generally conventional in the semiconductor fabrication art. Particular non-limiting examples include hard mask materials and photoresist mask materials. Photoresist mask materials are generally more common, and also more effective within the context of further processing of the CMOS structure whose schematic cross-sectional diagram is illustrated in FIG. 2. Non-limiting examples of photoresist materials include positive photoresist materials, negative photoresist materials and hybrid photoresist materials. Typically, the mask layer 14 comprises a positive photoresist material or a negative photoresist material that has a thickness from about 500 to about 10000 angstroms.

FIG. 2 also shows a dose of carbon implanting ions 15 implanted into the right hand side of the silicon-germanium alloy material layer 12 that is illustrated in FIG. 1 to thus provide from the silicon-germanium alloy material layer 12: (1) a silicon-germanium alloy material layer 12a (i.e., a sub-layer) that is covered by the mask layer 14; and (2) a silicon-germanium-carbon alloy material layer 12b (i.e., a sub-layer) that is not covered by the mask layer 14. The dose of carbon implanting ions 15 is provided with an aerial density and with an ion implantation energy that provides the silicon-germanium-carbon alloy material layer 12b with a preferably uniformly distributed carbon content from about 0.5 to about 3 atomic percent. To realize the foregoing uniform distribution of carbon content within the silicon-germanium-carbon alloy material layer 12b, the dose of carbon implanting ions 15 is typically provided at a dose from about 5E14 to about 2E16 carbon atoms per square centimeter and an ion implantation energy from about 1 to about 15 kev.

While FIG. 2 illustrates a carbon ion implant process for fabricating the silicon-germanium-carbon alloy material layer 12b from the silicon-germanium alloy material layer 12, the embodiment is not necessarily so limited. Rather, the embodiment also contemplates alternative methods for selectively introducing carbon into the silicon-germanium alloy material layer 12 when forming the silicon-germanium-carbon alloy material layer 12b. Such alternative methods may include, but are not necessarily limited to carbon diffusion methods and carbon plasma treatment methods.

Figure 3:
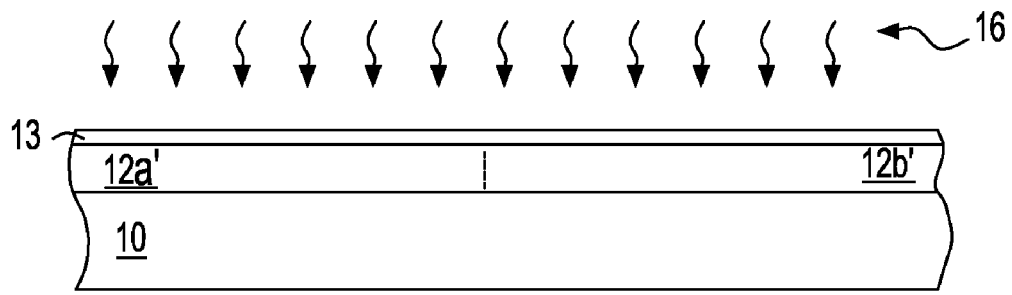

FIG. 3 first shows the results of stripping the mask layer 14 from the CMOS structure of FIG. 2. The mask layer 14 may be stripped from the CMOS structure of FIG. 2 using any of several methods and materials that are appropriate to the mask material from which is comprised the mask layer 14. When the mask layer 14 comprises a photoresist mask material, the mask layer 14 may be stripped using a wet chemical stripping method, a dry plasma stripping method or an aggregate of a wet chemical stripping method and a dry plasma stripping method.

FIG. 3 also shows the results of thermally annealing the CMOS structure that is illustrated in FIG. 2 to provide: (1) a silicon-germanium alloy material layer 12a' from the silicon-germanium alloy material layer 12a; and (2) a silicon-germanium-carbon alloy material layer 12b' from the silicon-germanium-carbon alloy material layer 12b. The thermal annealing is undertaken while using a thermal treatment 16. The thermal treatment 16 is provided to assure for recrystallization of the silicon-germanium-carbon alloy material layer 12b when forming the silicon-germanium-carbon alloy material layer 12b' (that again replicates the crystallographic orientation of the semiconductor substrate 10). Such a recrystallization is often needed since implanting exposed portions of the silicon-germanium material layer 12 with the dose of carbon implanting ions 15 that is illustrated in FIG. 2 often provides for amorphization of the silicon-germanium-carbon alloy material layer 12b. Although not specifically disclosed above, a pre-amorphization of a pertinent portion of the silicon-germanium alloy material layer 12 prior to implanting with the dose of carbon implanting ions 15 is often contemplated. Pre-amorphizing ions may include silicon, germanium and argon ions, without limitation thereto.

The thermal treatment 16 may be provided as a solid phase epitaxial thermal treatment at a temperature from about 550 to about 1200 degrees centigrade for a time period of up to about 300 minutes. Alternatively, the thermal treatment 16 may include a laser thermal annealing treatment that is otherwise generally conventional in the semiconductor fabrication art, and may include a temperature from about 1000 to about 1410 degrees centigrade for a time period from about 1 nanosecond to about 100 milliseconds.

Figure 4:
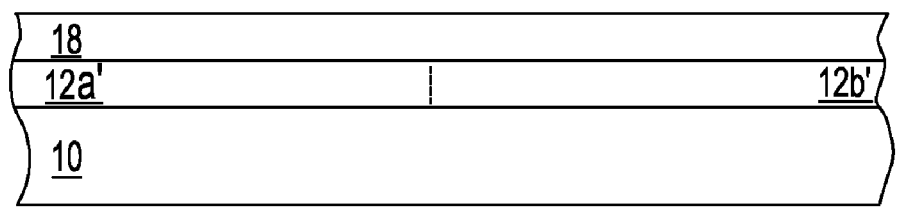

FIG. 4 first shows the results of stripping the screen layer 13 from the CMOS structure of FIG. 3. The screen layer 13 may be stripped using methods and materials that are otherwise generally conventional in the semiconductor fabrication art. When in particular the screen layer 13 comprises a silicon oxide screen material, the screen layer 13 may be stripped using a wet chemical stripping method that uses a hydrofluoric acid etchant. Alternatively, the screen layer 13 may be stripped using a dry plasma etching method.

FIG. 4 also shows a silicon material layer 18 located upon the silicon-germanium alloy material layer 12a' and the silicon-germanium-carbon alloy material layer 12b' after having stripped therefrom the screen layer 13. Similarly with the silicon-germanium alloy material layer 12 that is illustrated in FIG. 1, the silicon material layer 18 is also formed using an epitaxial chemical vapor deposition method that further preserves and replicates the crystallographic orientation of the semiconductor substrate 10. Typically, the silicon material layer 18 has a thickness from about 50 to about 1000 angstroms.

Figure 5:
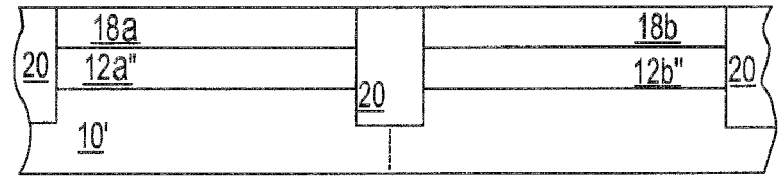

FIG. 5 shows a plurality of isolation regions 20 that is located within a corresponding plurality of isolation trenches that is etched through or into: (1) the silicon material layer 18 (i.e., to form a first silicon material layer 18a and a second silicon material layer 18b); (2) the silicon-germanium alloy material layer 12a' (i.e., to form a silicon-germanium alloy material layer 12a"); (3) the silicon-germanium-carbon alloy material layer 12b' (i.e., to form a silicon-germanium-carbon alloy material layer 12b"); and (4) the semiconductor substrate 10 (i.e., to form a semiconductor substrate 10'). FIG. 5 also assumes appropriate doping of the foregoing layers and semiconductor substrate 10' for eventual fabrication of an n-FET device that includes in-part the first silicon material layer 18a as a channel and a p-FET device that includes in-part the second silicon material layer 18b as a channel.

The isolation regions 20 may comprise any of several isolation materials that will typically comprise dielectric isolation materials. Typically, the isolation regions 20 comprise a dielectric isolation material selected from the same group of dielectric isolation materials that may be used for forming the buried dielectric layer 11. However a method used for fabricating the isolation regions 20 may be different from a method used for fabricating the buried dielectric layer 11. Typically, the isolation regions 20 comprise a silicon oxide or a silicon nitride dielectric material, or a composite or laminate thereof. Typically, the isolation regions 20 have conventional dimensions.

Figure 6:
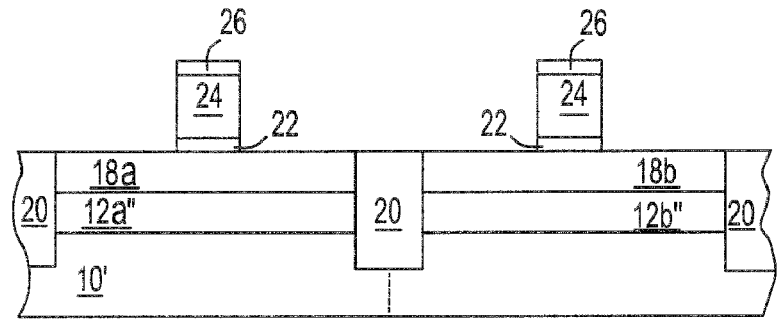

FIG. 6 shows (in cross-section): (1) a plurality of gate dielectrics 22 located upon the first silicon material layer 18a and the second silicon material layer 18b; (2) a plurality of gate electrodes 24 located upon the plurality of gate dielectrics 22; and (3) a plurality of capping layers 26 located upon the plurality of gate electrodes 24.

Each of the foregoing layers 22, 24 and 26 may comprise materials and have dimensions that are conventional in the semiconductor fabrication art. Each of the foregoing layers 22, 24 and 26 may also be formed using methods that are conventional in the semiconductor fabrication art. The gate dielectrics 22 may comprise conventional thicknesses of conventional dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, the gate dielectrics 22 may comprise generally higher dielectric constant dielectric materials having a dielectric constant from about 8 to at least about 100. Such higher dielectric constant dielectric materials may include, but are not limited to haffiium oxides, hafnium silicates, zirconium oxides, lanthanum oxides, titanium oxides, barium-strontium-titantates (BSTs) and lead-zirconate-titanates (PZTs). The gate dielectrics 22 may be formed using any of several methods that are appropriate to their material of composition. Non-limiting examples include thermal or plasma oxidation or nitridation methods, chemical vapor deposition methods (including atomic layer deposition methods) and physical vapor deposition methods.

The gate electrodes 24 may comprise conventional thicknesses of conventional gate electrode materials including but not limited to certain metals, metal alloys, metal nitrides and metal silicides, as well as laminates thereof and composites thereof. The gate electrodes 24 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods.

The capping layers 26 comprise a capping material that in turn typically comprises a hard mask material. Dielectric hard mask materials are most common but by no means limit the instant embodiment or the invention. Non-limiting examples of hard mask materials include oxides, nitrides and oxynitrides of silicon. Oxides, nitrides and oxynitrides of other elements are not excluded. The capping material may be formed using any of several methods that are conventional in the semiconductor fabrication art. Non-limiting examples include chemical vapor deposition methods and physical vapor deposition methods. Typically, the capping layers 26 comprise a silicon oxide capping material or a silicon nitride capping material that has a thickness from about 100 to about 1000 angstroms.

Figure 7:
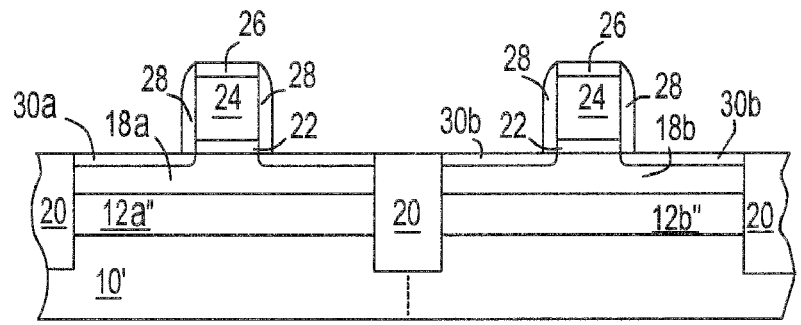

FIG. 7 shows a plurality of first spacers 28 located adjacent and adjoining opposite sidewalls (i.e., a plurality of spacer layers in cross-sectional view but a single spacer layer in plan view) of the gate dielectrics 22, gate electrodes 24 and capping layers 26. FIG. 7 also shows a plurality of extension regions 30a located within the first silicon material layer 18a (i.e., for an n-FET device) and a plurality of extension regions 30b located within the second silicon material layer 18b (i.e., for a p-FET device) and separated by a gate electrode 24, beneath which is a channel region that also separates the extension regions 30a or 30b.

Within the instant embodiment, either the first spacers 28 or the extension regions 30a and 30b, may be formed first, but typically the first spacers 28 will be formed first.

The first spacers 28 typically comprise a dielectric spacer material. Similarly with other dielectric structures within the instant embodiment, candidate dielectric spacer materials again include oxides, nitrides and oxynitrides of silicon. Also again, oxides, nitrides and oxynitrides of other elements are not excluded. The first spacers 28 are formed using a blanket layer deposition and anisotropic etchback method that uses an anisotropic etching plasma for etching purposes. The first spacers 28 may comprise a different dielectric material than the capping layer 26, although the same is not a limitation of the embodiment or the invention.

The extension regions 30a or 30b comprise dopants that are otherwise generally conventional in the semiconductor fabrication art. An n dopant is used for the n-FET extension regions 30a. A p dopant is used for the p-FET extension regions 30b. Non-limiting examples of n dopants include arsenic dopants, phosphorus dopants, halides thereof and hydrides thereof. Non-limiting examples of p dopants include boron dopants, halides thererof and hydrides thereof. Any of the foregoing dopants of appropriate polarity may be used for forming the extension regions 30a and 30b, and other doped regions described below within the instant embodiment. Less conventional alternative dopants are not excluded. As is noted above, the extension regions 30a and 30b may be formed either before or after forming the first spacers 28. Thus, the extension regions 30a and 30b are formed while using conventional processing conditions while using an ion implant method that uses at least a gate electrode 24 as a mask.

Figure 8:
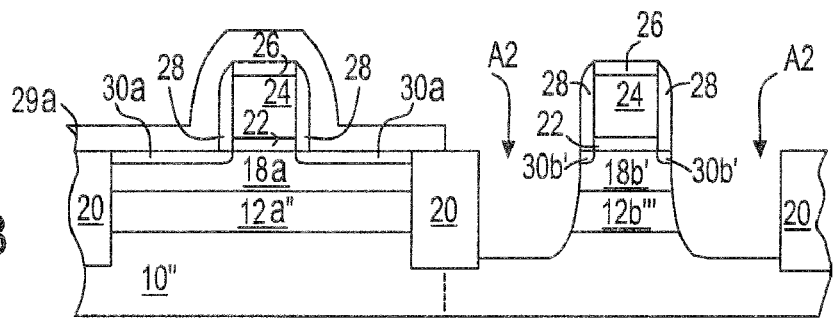

FIG. 8 first shows a first mask layer 29a located upon the gate electrode stack 22/24/26 (and adjoining first spacers 28) located over the first silicon containing material layer 18a. The first mask layer 29a may in general be formed from any of several mask materials, of which photoresist mask materials and hard mask materials are non-limiting examples. More specifically, the first mask layer 29a is typically required to be formed from a mask material that masks underlying materials with respect to both an etching process and a subsequent selective epitaxial deposition process. Thus, the first mask layer 29a typically comprises a hard mask material (i.e., that may include, but is not limited to, an appropriate selection from a silicon oxide material, a silicon nitride material or a silicon oxynitride material) that allows for etching of the second silicon material layer 18b, the silicon-germanium-carbon alloy material layer 12b'' and the semiconductor substrate 10' to form a plurality of trenches A2 that is bounded by the isolation regions 20, a second silicon material layer 18b', a silicon-germanium-carbon alloy material layer 12b''' and a semiconductor substrate 10''. Typically, the trenches A2 have a depth from about 100 to about 2000 angstroms.

The foregoing etching that forms the trenches A2 is typically effected using an anisotropic plasma etch method, although isotropic etch methods, including isotropic plasma etch methods and isotropic wet chemical etch methods, are not excluded. Typically, the anisotropic plasma etch methods will use a chlorine containing etchant gas composition that provides for etch selectivity of the silicon containing materials from which are comprised the second silicon material layer 18b, the silicon-germanium-carbon alloy material layer 12b'' and the semiconductor substrate 10', with respect to the isolation regions 20 and the masking layer 29a. Also shown within FIG. 8 are extension regions 30b' that derive from extension regions 30b that are illustrated in FIG. 7.

Figure 9:
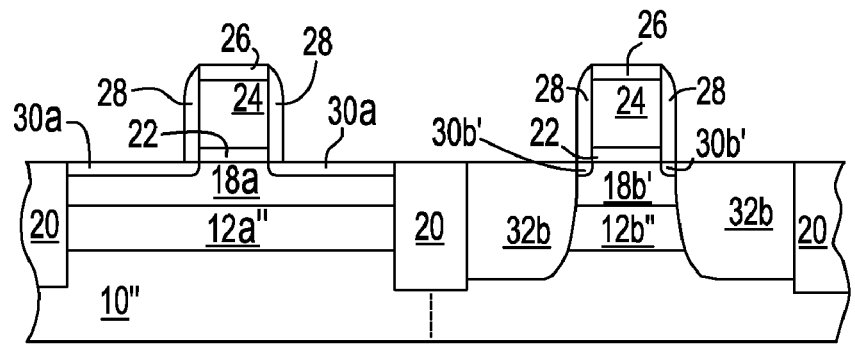

FIG. 9 shows the results of backfilling the trenches A2 that are illustrated within the schematic cross-sectional diagram of FIG. 8 with a plurality of silicon-germanium alloy material layers 32b that completely fill the trenches A2. The plurality of silicon-germanium alloy material layers 32b is intended to provide a surface nominally coplanar with the isolation regions 20. Similarly with other semiconductor material layers within the instant embodiment, the plurality of silicon-germanium alloy material layers 32b is intended to be formed using an epitaxial chemical vapor deposition method.

Figure 10:
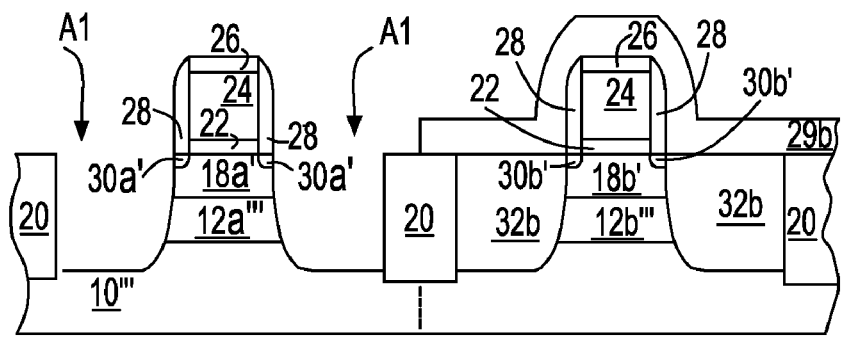
Figure 11:
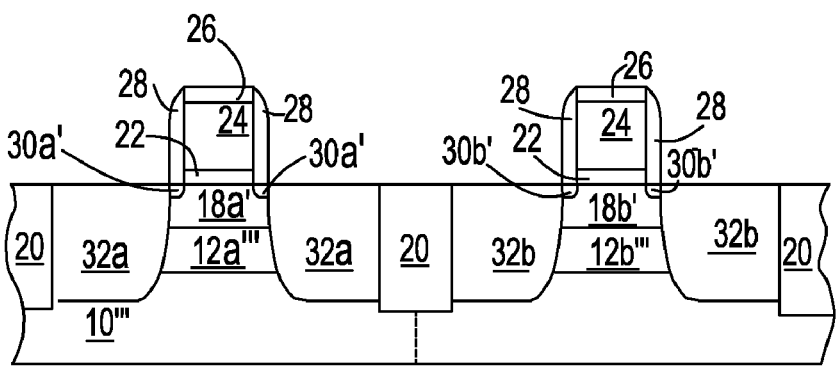

FIG. 10 and FIG. 11 correspond generally with FIG. 8 and FIG. 9, but instead use a mask layer 29b that covers the gate electrode stack 22/24/26 (and adjoining spacers 28) over the second silicon material layer 18b' and the silicon-germanium-carbide alloy material layer 12b''', rather than the first silicon material layer 18a and the silicon-germanium alloy material layer 12a''. As is illustrated more particularly within FIG. 10, the coverage described above provides for forming a plurality of trenches A1 by etching of the first silicon material layer 18a, the silicon-germanium material layer 12a'' and the semiconductor substrate 10'' to form a corresponding first silicon material layer 18a' (including extension regions 30a'), a corresponding silicon-germanium alloy material layer 12a''' and a corresponding semiconductor substrate 10'''. The trenches A1 are otherwise generally analogous with the trenches A2 that are illustrated in FIG. 8.

FIG. 11 in particular also shows silicon material layers 32a that are backfilled into the trenches A1 that are illustrated in FIG. 10. The silicon material layers 32a are otherwise generally analogous with the silicon-germanium alloy material layers 32b, but comprise a silicon (i.e., typically semiconductor) material rather than a silicon-germanium alloy (i.e., typically semiconductor) material.

FIG. 11 thus illustrates a CMOS structure including silicon material layers 32a for n-FET source and drain region locations and silicon-germanium alloy material layers 32b for p-FET source and drain region locations. Such a differential material composition for source and drain region locations within an n-FET device and a p-FET device within a CMOS structure is optional within the embodiment and the invention. Rather also, source and drain region locations within the CMOS structure of FIG. 11 may comprise either silicon semiconductor materials alone, or silicon-germanium alloy semiconductor materials alone.

Similarly, although the schematic cross-sectional diagrams of FIG. 8 to FIG. 11 illustrate the instant embodiment within the context of forming the silicon-germanium alloy material layers 32b into the trenches A2 prior to forming the silicon material layers 32a into the trenches A1 such a processing sequence is also not intended as limiting the instant embodiment. Rather, the instant embodiment also contemplates a processing sequence that provides for forming the silicon material layers 32a into the trenches A1 prior to forming the silicon-germanium alloy material layers 32b into the trenches A2. Under certain circumstances this alternative processing sequence may be preferred in comparison with the processing sequence that is illustrated in FIG. 8 to FIG. 11, although both processing sequences are within the context of the instant embodiment.

Figure 12:
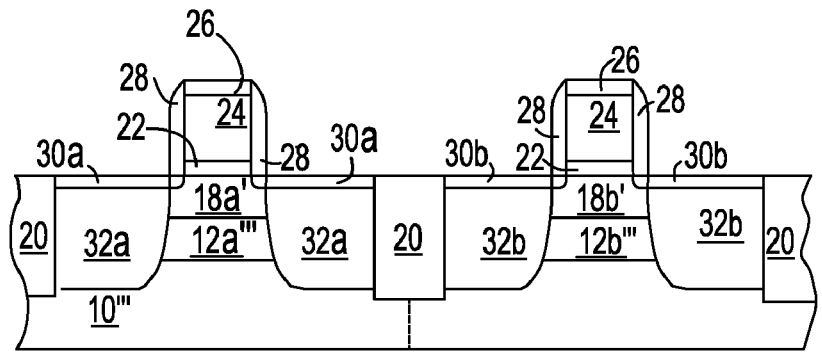

FIG. 12 shows a plurality of extension regions 30a and 30b that result from reimplanting the extension regions 30a' and 30b' while using the gate electrode stacks 22/24/26 and the first spacers 28 as a mask. The extension regions 30a and 30b are implanted using ion implantation conditions analogous, equivalent or identical to the ion implantation conditions used for fabricating the extension regions 30a and 30b in a first instance.

Figure 13:
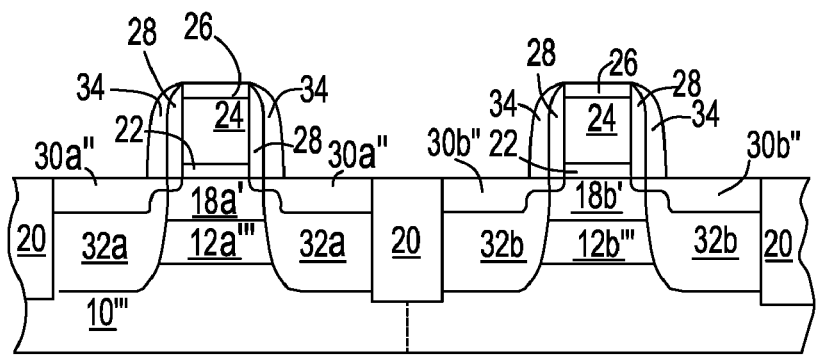

FIG. 13 first shows the results of forming a plurality of optional second spacers 34 located upon the plurality of first spacers 28. The plurality of second spacers 34 may comprise materials, have dimensions and be formed using methods that are analogous, equivalent or identical to the materials, dimensions and methods that are used for forming the plurality of first spacers 28. The plurality of second spacers 34 and the plurality of first spacers 28 may be formed of the same spacer material, although neither the embodiment nor the invention is so limited.

FIG. 13 also shows a plurality of source and drain regions 30a'' and 30b'' located at least in part within the plurality of silicon material layers 32a and the plurality of silicon-germanium alloy material layers 32b. The plurality of source and drain regions 30a'' and 30b'' is implanted to incorporate the plurality of extension regions 30a' and 30b'. The plurality of source and drain regions 30a'' and 30b'' is implanted while using the gate electrode stacks 22/24/26, the first spacers 28 and the second spacers 34 as a mask. Typically, the polarity of the source and drain regions 30a'' or 30b'' and the polarity of the corresponding extension regions 30a' or 30b' are identical, although the chemical compositions of individual dopant species used for forming the extension regions 30a and 30b, and the corresponding source and drain regions 30a'' and 30b'' may not necessarily be identical. Typically, the plurality of source and drain regions 30a'' and 30b'' is implanted to provide a dopant concentration from about 1E19 to about 2E21 dopant atoms per cubic centimeter within the larger contact region portions of the source and drain regions 30a'' and 30b''.

Figure 14:
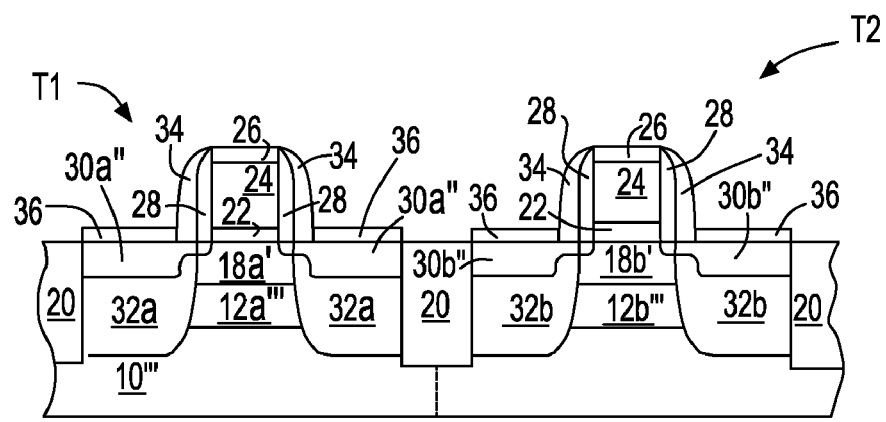

FIG. 14 first shows the results of stripping the capping layers 26 from the gate electrodes 24. Although not specifically illustrated within the context of the instant embodiment, the capping layers 26 may alternatively be removed prior to forming the source and drain regions 30a'' and 30b'', within the context of the schematic cross-sectional diagram of FIG. 13. The capping layers 26 may be stripped from the gate electrodes 24 while using stripping methods and materials that are conventional in the semiconductor fabrication art. Non-limiting examples include wet chemical stripping methods and materials, and dry plasma stripping methods and materials. Dry plasma stripping methods may under certain circumstances be preferred insofar as dry plasma stripping methods may allow for selective stripping of the capping layers 26 when the second spacers 34 comprise a similar material.

FIG. 14 also shows a plurality of silicide layers 36 located upon exposed silicon containing surfaces including the source and drain regions 30a'' and 30b'', and the gate electrodes 24. The silicide layers 36 may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 36 are formed using a salicide method. The salicide method includes: (1) forming a blanket silicide forming metal layer upon the semiconductor structure of FIG. 13 after stripping the capping layers 26 therefrom; (2) thermally annealing the blanket silicide forming metal layer with silicon surfaces which it contacts to selectively form the silicide layers 36 while leaving unreacted metal silicide forming metal layers on, for example, the second spacers 34 and the isolation regions 20; and (3) selectively stripping unreacted portions of the silicide forming metal layers from, for example, the second spacers 34 and the isolation regions 20. Typically, the silicide layers 36 comprise a nickel silicide material or a cobalt silicide material that has a conventional thickness.

FIG. 14 shows a CMOS structure in accordance with a preferred embodiment of the invention. The CMOS structure includes an n-FET device T1 that comprises a channel region that includes the first silicon material layer 18a' located upon the silicon-germanium alloy material layer 12a''', both of which are bounded by the silicon material layers 32a into which at least in part are located the source and drain regions 30a''. The CMOS structure also includes a laterally separated p-FET device T2 that comprises a channel region that includes a second silicon material layer 18b' located upon a silicon-germanium-carbon alloy material layer 12b''', both of which are bounded by the silicon-germanium material layers 32b at least in part within which are located the source and drain regions 30b'''. Within the CMOS structure in accordance with the embodiment, the silicon-germanium alloy material layer 12a''' within the n-FET device T1 provides for a desirable tensile strain within the n-FET device T1 channel. In addition, the silicon-germanium-carbon alloy material layer 12b''' within the p-FET device T2 provides for a desirably suppression of tensile strain within the p-FET device T2 channel, thus enhancing performance of the p-FET device T2.

The preferred embodiment of the invention is illustrative of the invention rather than limiting of the invention. Revisions and modifications may be made to methods, materials, structures and dimensions of a CMOS structure in accordance with the preferred embodiment, while still providing a CMOS structure in accordance with the invention, further in accordance with the accompanying claims.

What is claimed is:

1. A CMOS structure comprising:
  an n-FET device and a p-FET device located within and upon a substrate, wherein:
  said substrate includes a base semiconductor substrate, a silicon-germanium layer located directly on a first portion of said base semiconductor substrate, a first silicon material layer located directly atop said silicon-germanium layer, a silicon-germanium-carbon alloy layer located directly on a second portion of said base semiconductor substrate, a second silicon material layer located directly atop said silicon-germanium-carbon alloy layer, and at least one semiconductor material portion abutting said base semiconductor substrate and one of said first silicon material layer and said second silicon material layer and extending to a top surface of isolation regions;
  said n-FET device has a first channel comprising said first silicon material layer, wherein said first channel is directly atop said silicon-germanium alloy material layer; and
  said p-FET device has a second channel comprising said second silicon material layer, wherein said second channel is directly atop said silicon-germanium-carbon alloy layer.

2. The CMOS structure of claim 1 wherein the substrate comprises a bulk semiconductor substrate.

3. The CMOS structure of claim 1 wherein the substrate comprises a semiconductor-on-insulator substrate.

4. The CMOS structure of claim 1 wherein each of the first silicon material layer and the second silicon material layer has a thickness from about 50 to about 1000 angstroms.

5. The CMOS structure of claim 1 wherein each of the silicon-germanium layer and the silicon-germanium-carbon alloy material layer has a thickness from about 50 to about 1000 angstroms.

6. The CMOS structure of claim 1 wherein the silicon-germanium-carbon alloy material layer has a carbon content from about 0.5 to about 3 atomic percent.

7. The CMOS structure of claim 1 wherein each of the silicon-germanium layer and the silicon-germanium-carbon alloy material layer has a germanium content from about 5 to about 50 atomic percent.

8. The CMOS structure of claim 1 wherein said substrate includes first and second silicon material portions each abutting said base semiconductor substrate and said first silicon material layer.

9. The CMOS structure of claim 8 wherein said n-FET device includes first source and drain regions, wherein a portion of said first source and drain regions is located within said first and second silicon material portions.

10. The CMOS structure of claim 1 wherein said substrate includes first and second silicon-germanium alley portions each abutting said base semiconductor substrate and said second silicon material layer.

11. The CMOS structure of claim 10 wherein said p-FET device includes second source and drain regions, wherein a portion of said second source and drain regions is located within said first and second silicon-germanium portions.

12. A method for fabricating a CMOS structure comprising:
  forming over a base semiconductor substrate a first region and a second region, wherein said first region comprises a first silicon material layer located directly atop a silicon-germanium layer, wherein the first region is laterally separated from said second region, wherein said second region comprises a second silicon material layer located directly atop a silicon-germanium-carbon alloy material layer that is also formed over the base semiconductor substrate;
  forming at least one semiconductor material portion by deposition directly on said base semiconductor substrate and one of said first silicon material layer and said second silicon material layer, wherein said at least one semiconductor material portion extends to a top surface of isolation regions; and
  forming over the substrate an n-FET that uses the first silicon material layer that is located directly atop silicon-germanium layer in the first region as a first channel, and a p-FET that uses the second silicon material layer that is located directly atop the silicon-germanium-carbon alloy material layer in the second region as a second channel.

13. The method of claim 12 wherein the forming over the base semiconductor substrate uses a bulk semiconductor substrate.

14. The method of claim 12 wherein the forming over the base semiconductor substrate uses a semiconductor-on-insulator substrate.

15. The method of claim 12, further comprising forming first and second silicon material portions directly on said base semiconductor substrate and a portion of said first silicon material layer.

16. The method of claim 12, further comprising forming first and second silicon-germanium portions directly on said base semiconductor substrate and a portion of said second silicon material layer.

17. A method for fabricating a CMOS structure comprising:
  forming a silicon-germanium layer directly on a base semiconductor substrate;
  incorporating carbon selectively into the silicon-germanium layer to form a silicon-germanium sub-layer laterally adjacent a silicon-germanium-carbon alloy material sub-layer over the substrate;
  forming a first silicon material sub-layer directly atop the silicon-germanium sub-layer and a second silicon material sub-layer directly atop the laterally adjacent silicon-germanium-carbon alloy material layer;
  forming at least one semiconductor material portion by deposition directly on said base semiconductor substrate and one of said first silicon material layer and said second silicon material layer, wherein said at least one semiconductor material portion extends to a top surface of isolation regions;

forming an n-FET using the first silicon material sub-layer and the silicon-germanium sub-layer as a channel; and forming a p-FET using the second silicon material sub-layer and the silicon-germanium-carbon alloy material sub-layer as a channel.

18. The method of claim 17 wherein the incorporating carbon selectively uses an ion implantation method.

19. The method of claim 17 wherein the incorporating carbon selectively uses a diffusion method.

20. The method of claim 17, further comprising:

forming first and second silicon material portions directly on said base semiconductor substrate and a portion of said first silicon material layer; and forming first and second silicon-germanium portions directly on said base semiconductor substrate and a portion of said second silicon material layer.

* * * * *